United States Patent [19]
Nicole et al.

[11] Patent Number: 6,137,323
[45] Date of Patent: Oct. 24, 2000

[54] LOW-CONSUMPTION FREQUENCY TRANSLATOR

[75] Inventors: Pierre Nicole, Saint Cloud; Paul Bildstein, Verrieres le Buisson; Patrick Sangouard, Villiers sur Marne; Gaëlle Bazin, Vincennes, all of France

[73] Assignee: Dassault Electronique, Saint Cloud, France

[21] Appl. No.: 09/198,799

[22] Filed: Nov. 24, 1998

[30] Foreign Application Priority Data

Dec. 4, 1997 [FR] France ................................. 97 15311
Sep. 14, 1998 [FR] France ................................. 98 11426

[51] Int. Cl.[7] ................................................. H03B 19/00
[52] U.S. Cl. .......................................... 327/113; 327/355
[58] Field of Search .................................... 327/113, 114,
327/116, 119, 355–357, 361; 455/326, 189, 209; 377/47, 48

[56] References Cited

U.S. PATENT DOCUMENTS

| 4,461,022 | 7/1984 | Slagley | 327/113 |
| 5,140,198 | 8/1992 | Atherly et al. | 327/255 |
| 5,521,533 | 5/1996 | Swanke | 327/107 |
| 5,955,902 | 9/1999 | Takada et al. | 327/116 |

FOREIGN PATENT DOCUMENTS

| 58187005 | 1/1983 | European Pat. Off. . |
| 2047909 | 3/1972 | Germany . |
| 2282287 | 3/1995 | United Kingdom . |

OTHER PUBLICATIONS

D. Pache, J.M. Fournier, G. Billiot and P. Senn, An Improved 3V 2GHz BICMOS Image Reject Mixer IC, Proceedings Of The Custom Integrated Circuit Conference, Santa Clara, May 1–4, 1995, no. Conf. 17, May 1, 1995, pp. 95–98, Institute of Electrical and Electronics Engineers.

*Primary Examiner*—My-Trang Nuton
*Attorney, Agent, or Firm*—Christie, Parker & Hale, LLP

[57] ABSTRACT

A frequency translator includes two multipliers which receive one and the same high-frequency signal on first inputs in quadrature with respect to one another, and one and the same low-frequency signal on second inputs also in quadrature with respect to one another. Each multiplier comprises a pair of elements whose capacitance can be varied in a controlled manner, jointly and in opposite senses, connected in parallel. The respective outputs of the two elements of each pair are combined additively, considering their phase opposition, in order to form the outputs of the two multipliers which supply a summer.

21 Claims, 6 Drawing Sheets

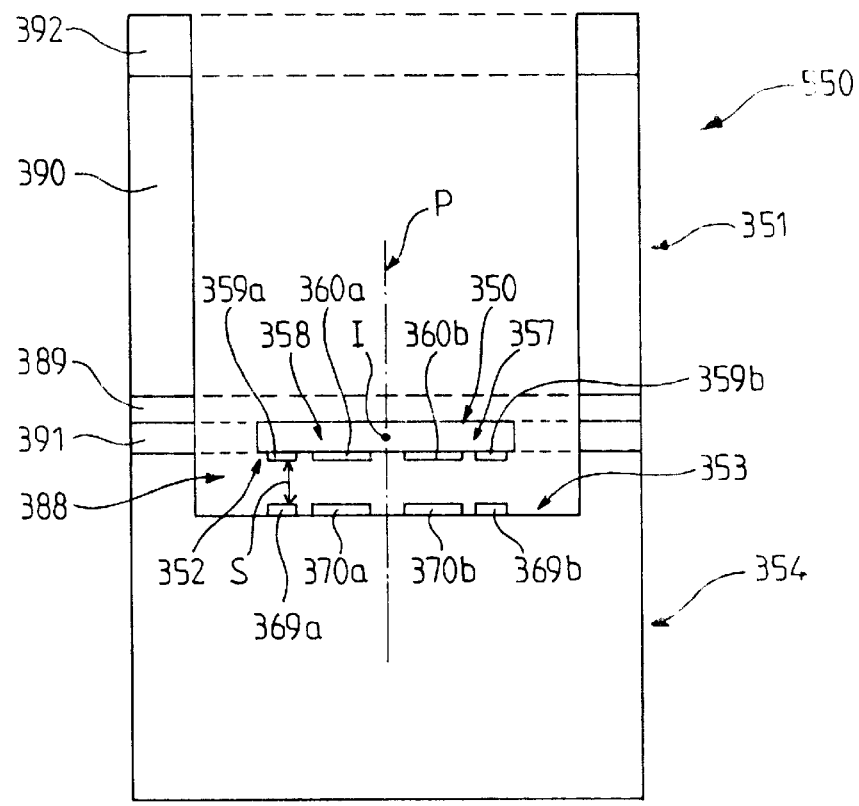
FIG. 6
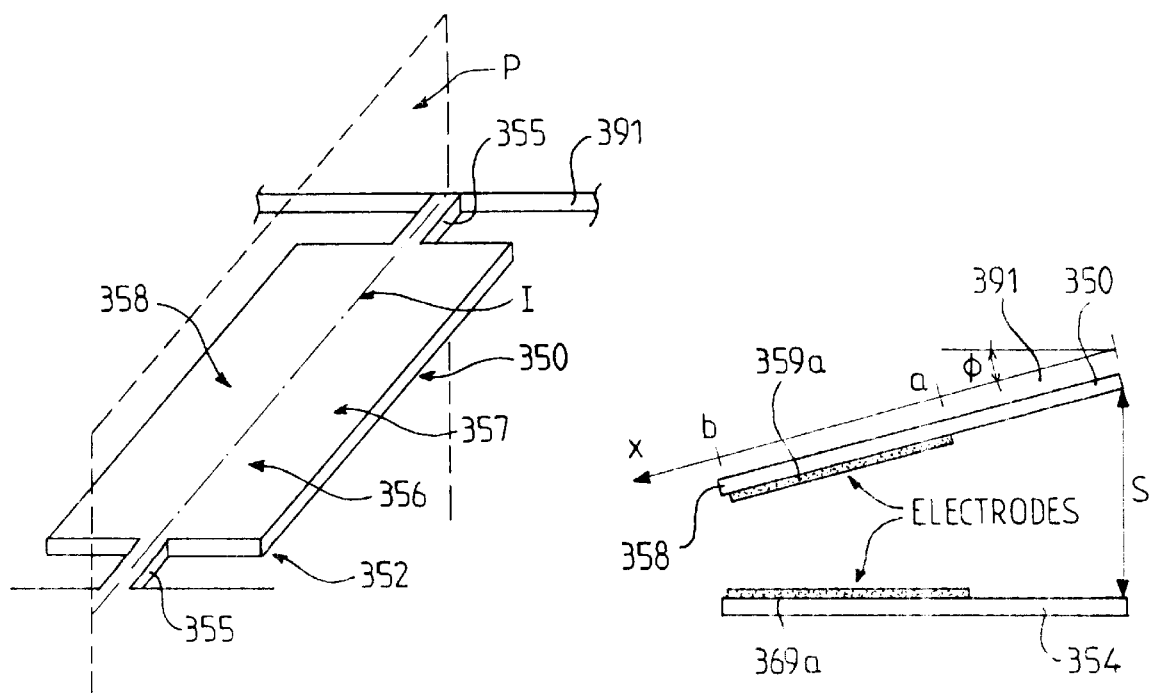
FIG. 7
FIG. 10

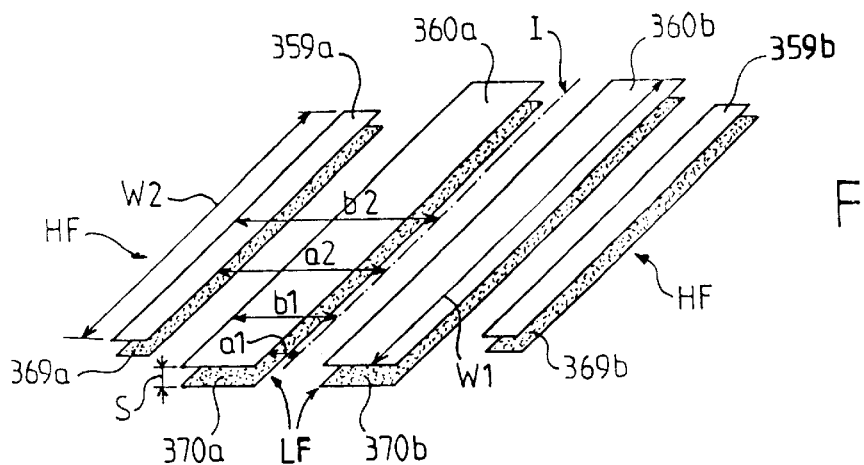
FIG. 8
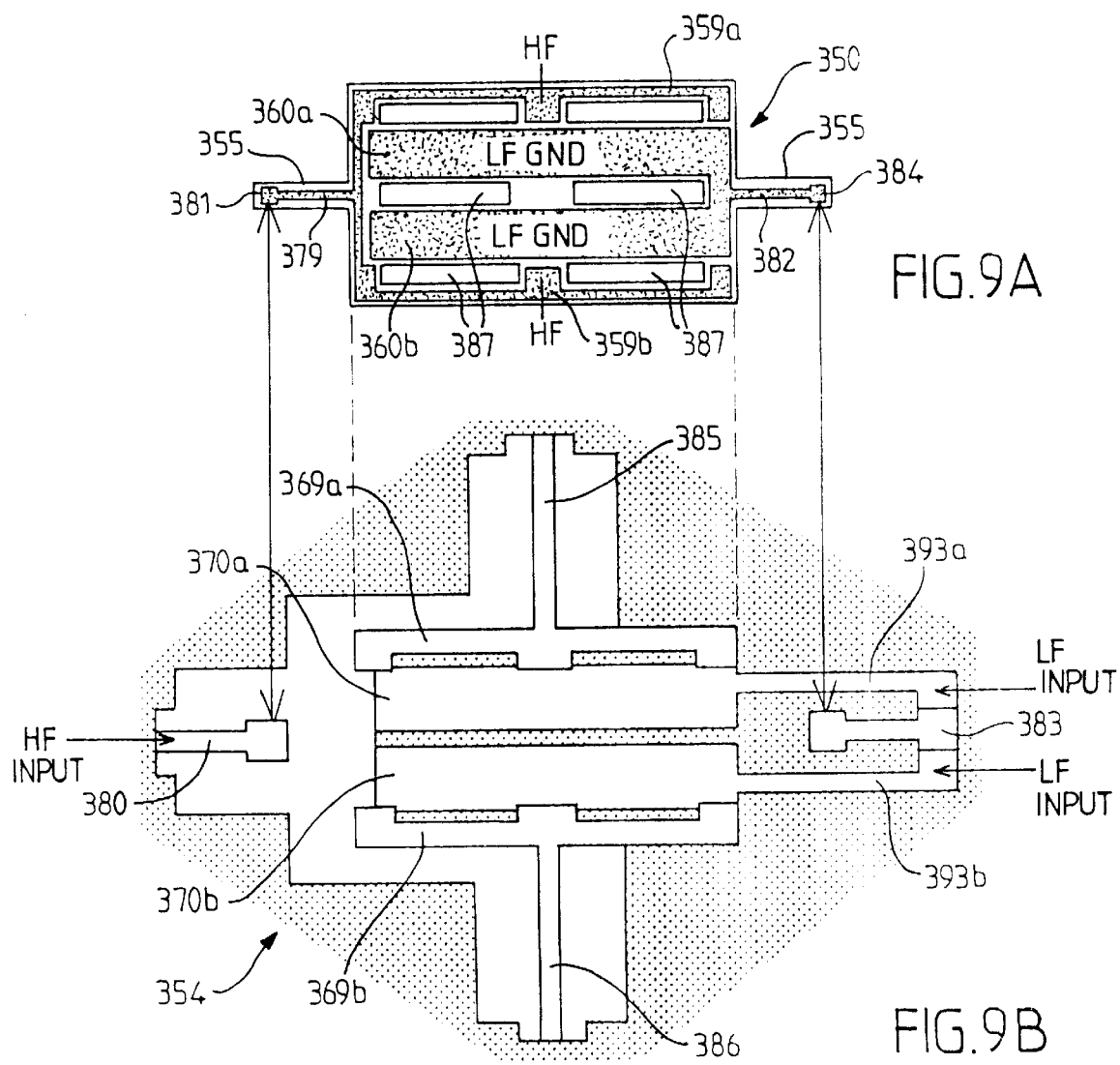
FIG. 9A
FIG. 9B

LOW-CONSUMPTION FREQUENCY TRANSLATOR

BACKGROUND OF THE INVENTION

The invention concerns frequency effect electronic devices.

Changing the frequency of a signal is known using a non-linear element, to which the initial signal F1 and a modulating signal f2 are applied. Acting as a mixer or multiplier, the non-linear element provides modulation products of the form (p*F1)+(q*f2), where p and q are two positive or negative integers. The desired modulation product is extracted by filtering. Although they perform a multiplication, these devices are sometimes referred to as "frequency translators", since they make it possible to obtain, notably, F1+f2.

The invention more particularly concerns the conventional frequency translators which directly provide the addition or translation F1+f2, by multiplication, but without requiring filtering.

To implement such conventional frequency translators, a so-called "variable delay" technique can be used, this delay being arranged to correspond to a phase shift increasing linearly with time. This technique uses the fact, since the frequency is the derivative of the phase with a factor of approximately ½π, the output signal has additional frequency. This variable delay can be implemented in analog form or in digital form. However, these so-called "serrodyne" techniques used currently are quite difficult to implement as regards the hardware.

Furthermore, these techniques require components whose size is relatively large.

SUMMARY OF THE INVENTION

The object of the present invention therefore is to provide an analog solution which does not have all or some of the aforementioned drawbacks.

One object of the invention is to provide a frequency translator which has a very good parasitic frequency rejection.

Another aim of the invention is to provide a frequency translator with very low consumption, in particular for mobile applications.

Yet another object of the invention is to provide a device capable of operating, notably, in wide-band, all the frequencies which constitute a given signal remaining simultaneously translated by the same amount.

The device concerned comprises in a known manner two multipliers suitable for receiving one and the same high-frequency signal on first inputs in quadrature with respect to one another, and one and the same low-frequency signal on second inputs also in quadrature with respect to one another, and a summer of the outputs of these multipliers.

This device according to the invention is original in that each multiplier comprises a pair of elements whose capacitance can be varied in a controlled manner, jointly and in opposite senses, connected in parallel, and in that the respective outputs of the two elements of each pair are combined additively, considering their phase opposition, in order to form the outputs of the two multipliers. Such a device is capable of a frequency effect, namely the translation of the whole incoming high-frequency signal by the local low-frequency signal.

In a preferential embodiment, each element of a pair is defined by a varactor (or biased varicap diode), the two varactors of a pair being connected in parallel from a common point and reverse biased.

In this preferential embodiment, it is particularly advantageous, although a different procedure can be followed, that the first and the second input of each multiplier reach the common point of the two varactors by separate decoupled connections.

In another embodiment, the element pairs are implemented using a micromechanical device. More precisely, each element pair is defined by:

a first support provided, on the one hand, with two high-frequency (HF) conductive tracks placed symmetrically on either side of a first plane of symmetry and each having one output, and, on the other hand, two low-frequency (LF) conductive tracks supplied separately by the second input and placed symmetrically on either side of the first plane of symmetry;

a second support from which, able to rotate around an axis, a membrane is suspended, subdivided into two half-parts, on either side of a second plane of symmetry including the axis, and carrying, on the one hand, two HF conductive tracks connected to the first input and placed symmetrically on either side of the second plane of symmetry, and, on the other hand, two LF conductive tracks connected to earth and placed symmetrically on either side of the second plane of symmetry.

The first and second supports are immovably attached to one another so that the first and second planes of symmetry are substantially identical and the HF, respectively LF, tracks of the first support are superposed on the HF, respectively LF, tracks of the second support.

Here, a pair element is formed, on the one hand, from a half-membrane provided with its HF track and its LF track and, on the other hand, with the HF track and the LF track which correspond to them on the first support.

The high-frequency and low-frequency inputs are here completely decoupled.

Advantageously, the membrane, which is made preferably by etching of the RIE (Reactive Ion Etching) type, may have one or more through holes, of chosen dimensions, so as to reduce the damping of air flows in the structure.

In a particularly advantageous manner, the micromechanical element pair is made of glass/silicon type materials. More precisely, the first support is preferably formed from a glass block, and the second support is preferably formed from a stack of a layer of silicon dioxide ($SiO_2$) inserted between a lower substrate of silicon and an upper layer of silicon, in which the membrane is formed.

It may also be particularly advantageous, for filtering reasons, notably in the embodiment with varactors, that each multiplier includes an inductor between each variable-capacitance element and its common point.

According to other characteristics of the invention, advantageous but optional, and usable independently of one another, just as easily in combination, in totality as well as in part:

the high-frequency phase shifts may be implemented by delay lines, in particular made of coaxial cable, notably in narrow-band applications;

the low-frequency phase shifts may be implemented, notably in narrow-band applications, by one or more "R-C" type cells forming a differentiator on one channel, and one or more "C-R" type cells forming an integrator on the other channel, the whole being arranged to provide the phase quadrature of one channel with the other;

the phase shifts, notably in wide-band or very-wide-band applications, are implemented using phase-difference networks, at high frequency or low frequency;

the separate decoupled connections are taken to a biasing reference voltage.

DESCRIPTION OF THE DRAWINGS

Other characteristics and advantages of the invention will emerge from an examination of the detailed description below, and from the accompanying drawings, in which:

FIG. 6 is a transverse sectional view along the axis VI—VI of FIG. 5;

FIG. 7 illustrates, very schematically and in perspective, the membrane used in the pair of elements whose capacitance can be varied in a controlled manner, of the second type, of FIGS. 5 and 6;

FIG. 8 illustrates schematically the capacitances formed by the superposition of the HF and LF tracks carried by the membrane and the first support;

FIGS. 9A and 9B detail one embodiment of the HF and LF tracks carried respectively by the membrane and the first support;

FIG. 10 is a diagram illustrating the capacitance-varying mechanism of the element pair of the second type illustrated in FIGS. 5 to 9.

The accompanying drawings are primarily of a definite nature. Consequently, they may not only allow better understanding of the detailed description, but also contribute towards the definition of the invention.

DETAILED DESCRIPTION

Figure 1:
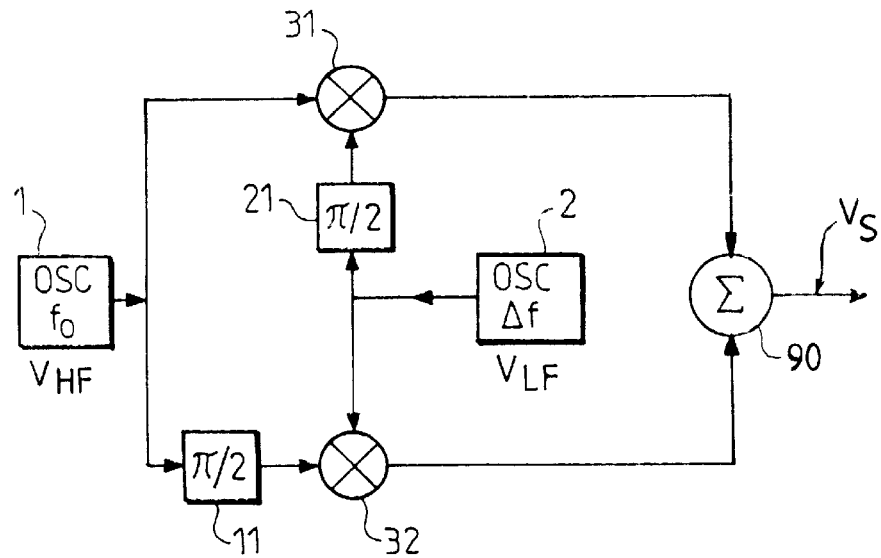
FIG. 1 is a general block diagram of a frequency translator.

In FIG. 1, the references 1 and 2 designate respectively sources of high frequency $f_0$ and of low frequency $\Delta f$, shown here as oscillators. The output of the high-frequency source 1 is applied directly to a first input of a multiplier 31, and indirectly via a $\pi/2$ (lead quadrature) phase shifter 11 to a first input of a second multiplier 32.

Similarly, the output of the low-frequency source 2 is applied directly to a second input of the second multiplier 32, whilst it is applied indirectly via a $\pi/2$ (lead quadrature) phase shifter 21 to a second input of the first multiplier 31. The outputs of the two multipliers 31 and 32 are applied to a summer 90.

This arrangement is to be considered as known, at least in its principle. It provides a signal of the form:

$$S = A \cdot \sin(2\pi \cdot (f_0 + \Delta f) \cdot t)$$

The present invention proposes an original embodiment of such an arrangement, which has many advantages, including that of being able to work at very high frequencies, with a very low consumption, in wide-band for the high-frequency input (source), while performing a true translation of all the input high frequencies, as defined in the introduction, with a very good parasitic frequency rejection.

Figure 2:
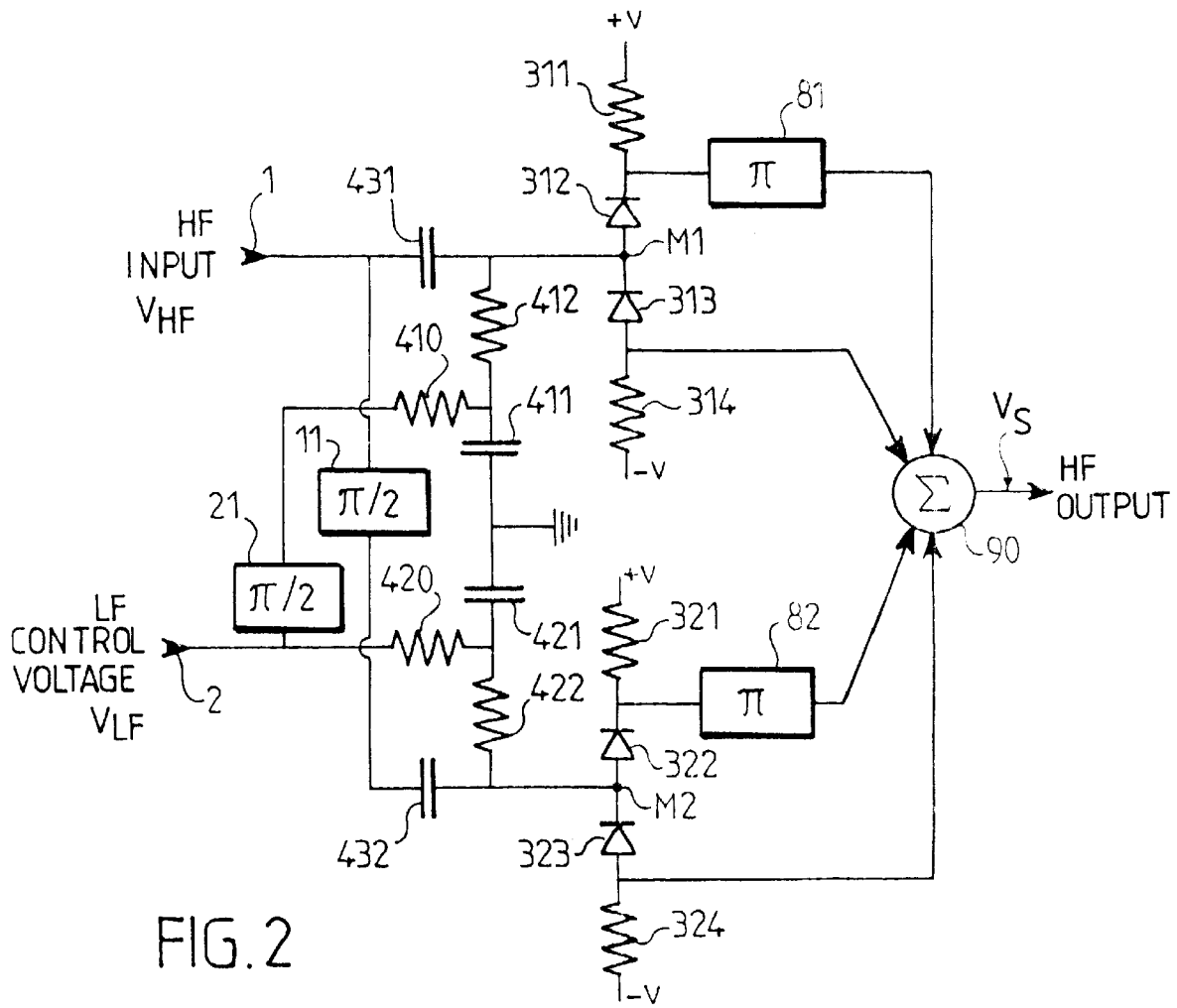
FIG. 2 is a diagram of an embodiment of a frequency translating device according to the invention equipped with pairs of elements whose capacitance can be varied in a controlled manner of a first type.

A complete embodiment of a frequency translator allowing all this is illustrated in FIG. 2. The high-frequency (HF) input (source) is illustrated as 1, while the low-frequency (LF) input (source) is illustrated as 2, this being here, more precisely, a low-frequency control voltage.

The first multiplier, equivalent to that referenced 31 in FIG. 1, has a pair of elements whose capacitance can be varied in a controlled manner, jointly and in opposite senses, and having a common point M1 connected to the high-frequency source 1 via a capacitor 431. Each element is here formed from a reverse-biased varicap diode or varactor 312 or 313.

The output of the first varactor 312, reverse-connected, is connected on the one hand to a module for phase-shifting 81, here by $\pi$, and, on the other hand, to a first terminal set at a voltage +V via a resistor 311. The output of the phase shifter 81 forming a first output of the first multiplier 31 is connected to the first input of a summer 90. The output of the second varactor 313, reverse-connected, forming a second output of the first multiplier 31, is connected on the one hand directly to a second input of the summer 90, and, on the other hand, to a second terminal set at a voltage −V via a resistor 314. The two varactors 312 and 313 are thus connected in parallel in relation to the common point M1 and the summer 90.

The common point M1 is also connected, in this embodiment, to the low-frequency source 2 via, in this order, a first resistor 412, a second resistor 410 and a $\pi/2$ phase shifter equivalent to that illustrated in FIG. 1, the connection point between the two resistors 412 and 410 being connected to earth via a capacitor 411. In the ultrahigh-frequency domain, such a $\pi/2$ phase shifter is sometimes directly implemented using a coupler of appropriate structure, like for example a hybrid coupler, well known to persons skilled in the art.

The values of the resistor 412 (R') and of the capacitances of the capacitors 431 (Ce) and 411 (C'), which provide the decoupling of the HF and LF signals, are chosen so that each of these signals does not interfere with the other by "returning" into the part of the circuit which belongs to it. Ce (431) is therefore chosen so that the remainder of the low frequency is attenuated as much as possible at the high-frequency input, whilst C' (411) and R' (412) are chosen so that the remainder of the high frequency is attenuated as much as possible at the low-frequency input. In other words, Ce serves as a filter cutting out the low frequency while allowing high frequency to pass, whilst C' and R' serve as a filter cutting out the high frequency while allowing low frequency to pass. The device is therefore not limited to the HF and LF filters illustrated in the figures.

Similarly, the second multiplier, equivalent to that referenced 32 in FIG. 1, has a pair of elements whose capacitance can be varied in a controlled manner, jointly and in opposite senses, and having a common point M2 connected to the high-frequency source 1 via, in this order, a capacitor 432 and a $\pi/2$ phase-shift module 11 equivalent to that illustrated in FIG. 1. Each element is here also formed from a reverse-biased varicap diode or varactor 322 or 323.

The output of the first varactor 322, reverse-connected, is connected on the one hand to a module for phase shifting 82, here by π, and, on the other hand, to a first terminal set at a voltage +V via a resistor 321. The output of the phase shifter 82 forming a first output of the second multiplier 32 is connected to the third input of the summer 90. The output of the second varactor 323, reverse-connected, forming a second output of the second multiplier 32, is connected on the one hand directly to a fourth input of the summer 90, and, on the other hand, to a second terminal set at a voltage −V via a resistor 324. The two varactors 322 and 323 are thus connected in parallel in relation to the common point M2 and the summer 90.

The common point M2 is also connected to the low-frequency source 2 via, in this order, a first resistor 422 and a second resistor 420, the connection point between the two resistors 422 and 420 being connected to earth via a capacitor 421.

The two capacitors 411 and 421, taken back to earth, are thus connected to the mid-point M between the two supply voltages +V and −V. This characteristic is worthwhile, but not mandatory.

The first input of the first multiplier 31, which supplies it with high frequency, is therefore in quadrature with respect to the first input of the second multiplier 32, which supplies it with the same high-frequency signal. Similarly, the second input of the second multiplier 32, which supplies it with low frequency, is in quadrature with respect to the second input of the first multiplier 31, which supplies it with the same low-frequency signal.

The multipliers 31 and 32 constituted in this way therefore each have two outputs, in phase opposition with respect to one another. The summer 90 then performs the summation of these four outputs of the multipliers so as to provide the output signal Vs.

For the best results, the varactor pairs 312 and 313, respectively 322 and 323, are well matched, preferably very well matched, so as to obtain high parasitic frequency rejection levels.

By modifying the biasing point of the two varactors of a pair (or couple), the low-frequency signal originating from the source 2 increases the capacitance of one and reduces the capacitance of the other.

More precisely, the assembly described can be considered as a two-channel balanced capacitive bridge. This is why, since the bridge is balanced, any increase in one of the two capacitances results in a reduction in the other. In a first approximation where the variation in capacitance is assumed to be linear as a function of the voltage, the two capacitances seen by the high-frequency source 1 for each multiplier are given by the following formulae:

$$*C_1(V_{LF}) = C_0 \cdot (1 - \alpha \cdot V_{LF})$$

$$*C_2(V_{LF}) = C_0 \cdot (1 + \alpha \cdot V_{LF})$$

with $\alpha \neq 0$ (in the example illustrated in FIG. 2, $\alpha < 0$), $C_0$ being the mean capacitance of the diodes, $C_1$ designating the capacitance of the varactor 312 or 322 of the first 31 or second 32 multiplier, connected to the terminal set at the voltage +V, and $C_2$ designating the capacitance of the varactor 313 or 323 of the first 31 or second 32 multiplier, connected to the terminal set at the voltage −V.

The output signal $Vi_S$ (i=31, 32), for the summation of the two outputs of one and the same multiplier, can then be written as a function of the high-frequency input signal $V_{HF}$ and the low-frequency signal $V_{LF}$ as indicated below.

$$Vi_S = V_{HF} \cdot \left( \frac{j \cdot \omega \cdot R_0 \cdot C_2}{1 + j \cdot \omega \cdot R_0 \cdot C_2} - \frac{j \cdot \omega \cdot R_0 \cdot C_1}{1 + j \cdot \omega \cdot R_0 \cdot C_1} \right)$$

where $R_0$ is the impedance seen by the output signal of each output of a multiplier.

This expression can, after expansion and then simplification, be converted into:

$$Vi_S = j \cdot \omega \cdot R_0 \cdot C_0 \cdot \left( \frac{2 \cdot \alpha \cdot V_{LF}}{(1 + j \cdot \omega \cdot R_0 \cdot C_0)^2 - (\alpha \cdot V_{LF})^2 \cdot (j \cdot \omega \cdot R_0 \cdot C_0)^2} \right) \cdot V_{HF}$$

When the value ($\alpha \cdot V_{LF}$) remains small, typically up to a value of around 0.2, an approximation of the above expression (2) can be made to obtain the following formula:

$$Vi_S = 2 \cdot \alpha \cdot V_{LF} \cdot \left( \frac{j \cdot \omega \cdot R_0 \cdot C_0}{1 + j \cdot \omega \cdot R_0 \cdot C_0)^2} \right) \cdot V_{HF}$$

where:

$$\alpha = \frac{\Delta C}{C \cdot \Delta V_{LF}}$$

Persons skilled in the art will appreciate that the output signal of a multiplier $Vi_s$ (i designates one or other of the multipliers) is clearly this time a product of the high-frequency input signal $V_{HF}$ and the low-frequency control voltage $V_{LF}$.

In such a device with diodes, the HF voltage ($V_{HF}$) and LF voltage ($V_{LF}$) are superposed and simultaneously cause the value of the instantaneous capacitance of each diode to change. It is therefore necessary to provide a second condition, in addition to that concerning the value of ($\alpha \cdot V_{LF}$), so as to obtain, at the output of the multiplier, an almost pure spectrum, that is one having only a few secondary harmonics.

This second condition is given by the following relationship: $V_{HF} \ll V_{LF}$. Typically, a $V_{HF}/V_{LF}$ ratio between around 0.1 and 0.01, perhaps even smaller, will preferably be chosen.

From this, the assembly illustrated in FIG. 2, which has two multipliers working in the same manner, but with control voltages shifted by π/2 and working in opposite senses, will clearly provide the result given in accordance with the block diagram of FIG. 1.

Figure 3:
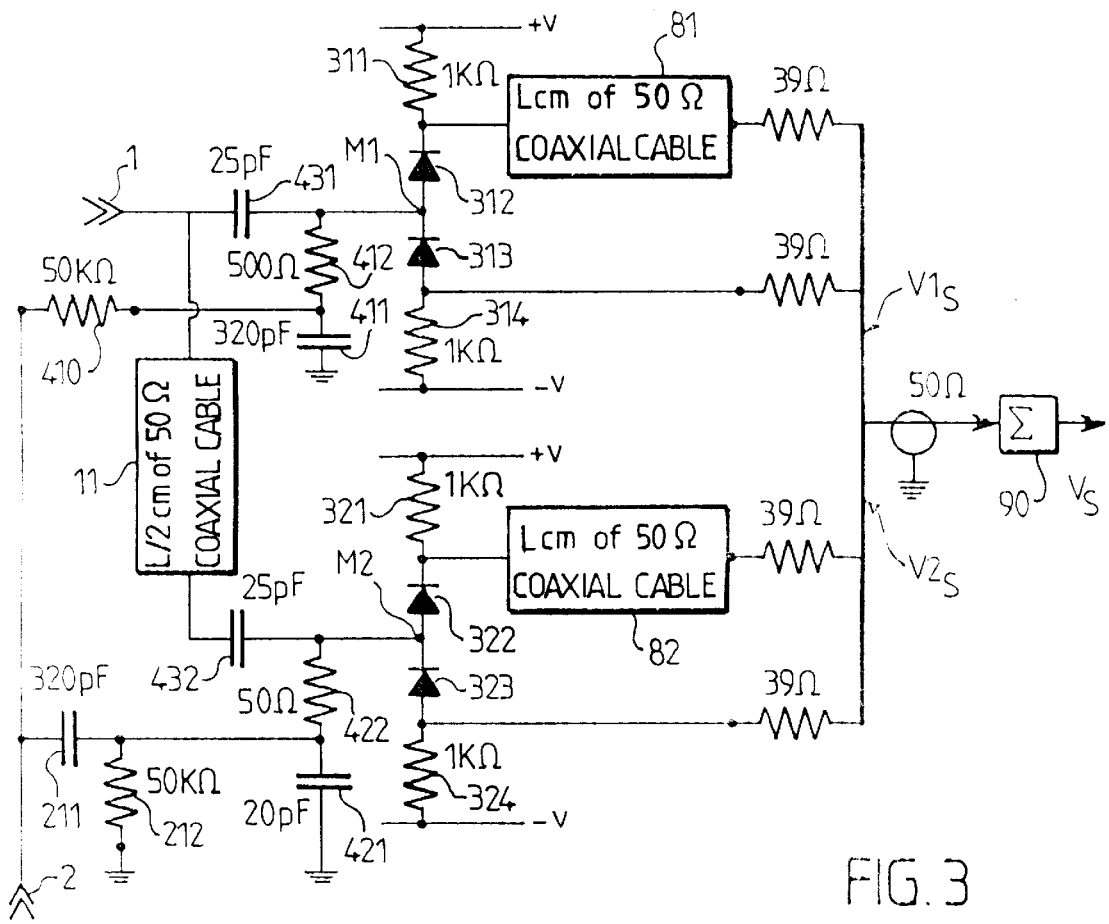
FIG. 3 is a diagram of the frequency translator of FIG. 2 detailing one embodiment of the phase-shift modules.

The phase shifts applied at high frequency, notably by the phase shifters 81, 82 and 11, may be implemented in different ways known to persons skilled in the art. FIG. 3 illustrates a detailed embodiment of the frequency translator of FIG. 2, in which certain of the phase-shift modules are, on account of the ultrahigh-frequency signals, implemented by delay lines, suitably calibrated (for example for narrow-band applications). This is notably the case for the π phase shifters 81 and 82 and the π/2 phase shifter 11.

In wide-band applications, perhaps even very-wide-band applications, use will be made of wide-band or very-wide-band π/2 phase shifters, like for example those implemented using phase-difference networks. Such networks are notably described in the documents by S. D. BEDROSIAN "Normalized Design of 90° Phase-Difference Networks", IRE Transactions on Circuit Theory, June 1960, pp.128–136 and by D. K. WEAVER, Jr. "Design of RC Wide-Band 90-Degree Phase-Difference Network", Proceedings of the IRE, April 1954, pp.671–676. They are formed from two quadripoles supplied by one and the same input signal, and whose respective outputs are subtracted so as to provide the $\pi/2$ phase shift.

In this example embodiment, the v phase shifts 81 and 82 are more precisely obtained using coaxial cables, preferably with an impedance of 50 Ω, and with a length L adapted to the said phase shift, while the $\pi/2$ phase shift 11 is more precisely obtained using a coaxial cable of the same type (here an impedance of 50 Ω equivalent to the impedance on the high-frequency input), and with a length L/2 adapted to the said $\pi/2$ phase shift.

At low frequency and for narrow-band signals, the applicant observed that it was preferable to make not one single phase shift of $\pi/2$ between the two second low-frequency inputs of the multipliers 31 and 32, as illustrated in FIG. 2, but, better, two phase shifts of $\pi/4$ of opposite senses respectively on each second multiplier input.

To that end, it is possible to use the fact that C-R type circuits organized as differentiators produce a phase lead, whereas R-C type circuits organized as integrators produce a phase lag. With one or more circuits of the same type, a $\pi/4$ phase lead can therefore be implemented on one of the channels, and a $\pi/4$ phase lag on the other, which amounts to a relative shift in quadrature ($\pi/2$) between the channels. Moreover, such an implementation by means of an RC circuit is perfectly compatible with the assembly, whose impedances it can, in addition, match.

In this example, a phase shift of $-\pi/4$ is therefore obtained by using, on the channel connecting the second input of the first multiplier 31 to the low-frequency source 2, the integrating R-C circuit formed by the resistor 410 and the capacitor 411, while a phase shift of $+\pi/4$ is obtained by using, on the channel connecting the second input of the second multiplier 32 to the low-frequency source 2, a differentiating C-R circuit formed by the capacitor 211 and the resistor 212 of around 50 kΩ connected to earth.

In FIG. 3, all the components values are given by way of a non-limitative example. These values constitute, here, a compromise making it possible to obtain a low impedance with regard to the high frequency, which in this application is around 1.65 GHz, and an impedance which is high compared with 50 kΩ (the impedance on the low-frequency input) with regard to the low frequency, which in this application is around 10 kHz. Furthermore, the level of the high-frequency input is around −10 dBm at maximum, while the level of the low-frequency input is around 500 mV peak-to-peak.

Still in this example, the varactors, which may be those of the Hewlett-Packard 5082-3080 series, are reverse biased under voltages of around +/−2.5 volts.

Of course, other component values can be used according to application, and notably according to the high and low working frequencies. Thus, the high-frequency input may be a frequency going from a few megahertz to a few tens of gigahertz, while the low-frequency input may be a frequency going from a few hertz to a few tens of kilohertz, typically 50 kHz. In general, the values are fairly typically a few kilohertz, for example, in applications for telecommunications with mobiles where the effect of Doppler shifts must be limited. Similarly, depending on the type of varactor chosen, the voltages +V and −V may go from +/−1 volt to around +/−10 volts. Finally, the coupling resistors are chosen notably according to the cut-off frequency it is wished to obtain on the low-frequency control voltage 2.

Figure 4:
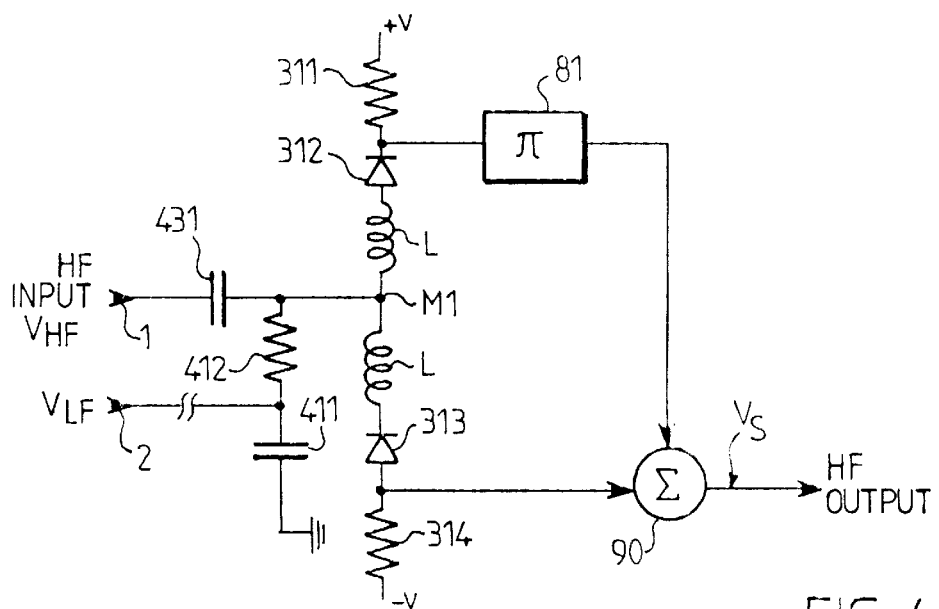
FIG. 4 illustrates a multiplier variant applicable to the devices of FIGS. 2 and 3.

In order to improve the output signal to input signal ratio of the device, which is reduced on account of the use of RC or CR modules, it is possible, as illustrated in FIG. 4, to place, in series between each diode and its common point Mi, an inductor L. The value of L is chosen so that the condition $L \cdot C_0 \cdot \omega^2 = 1$ is verified (with $\omega = 2\pi f$, f being the HF frequency, and $C_0$ being the value used in the formulae for the capacitances $C_1$ and $C_2$).

In this way, an output signal can be obtained which may be up to twice as large (in amplitude) as the value it had with no inductor in the device. In other words, up to 6 dB may be gained on the insertion, or rather conversion, loss. Moreover, this solution makes it possible, by choosing the values R of the resistors 311, 312, 321 and 322 equal to that of a characteristic resistance $R_0$ seen on the output of a multiplier (typically 50 Ω or 75 Ω), to make the high-frequency path fully matched.

Furthermore, the optimum values of the resistors R and $C_0$ being linked here by the relationship $R \cdot C_0 \cdot \omega \approx 1$ (for the HF), by taking $R = R_0$, the value of $C_0$ can be deduced from this, thus making it possible to directly determine the choice of the diodes and their biasing point.

It may be noted that this relationship $R \cdot C_0 \cdot \omega \approx 1$ makes it possible, whether or not the device has inductors, to obtain the maximum amplitude of the signal at the output of the device.

FIGS. 5 to 11 are now referred to in order to describe another embodiment of the pairs of elements whose capacitance can be varied in a controlled manner. This embodiment uses a micromechanical device with very small dimensions.

The element pairs (312, 313) and (322, 323) which are used in the multipliers 31 and 32 of the frequency translators illustrated in FIGS. 2 to 4 may be replaced by pairs of another type.

Figure 5:
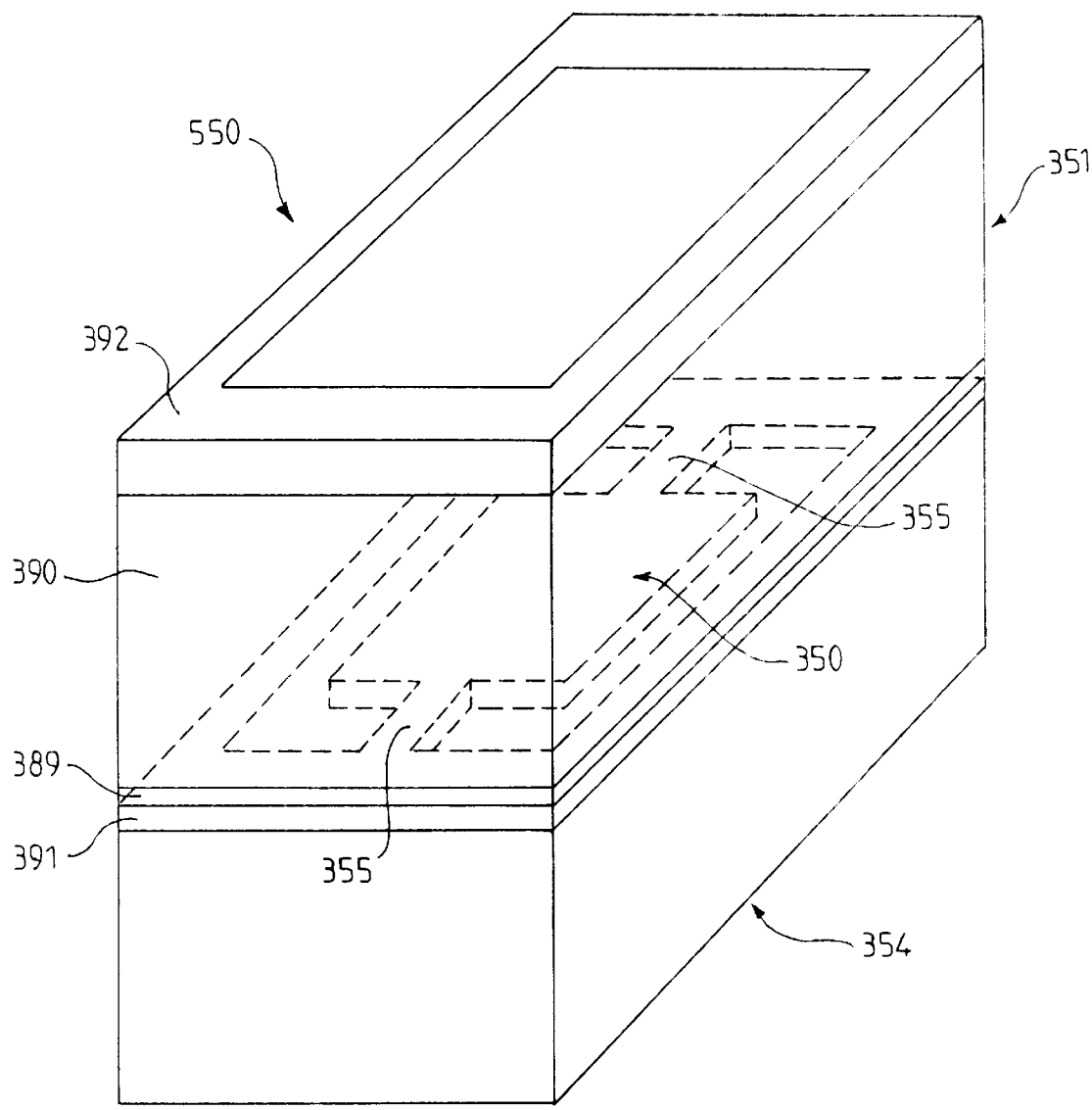
FIG. 5 illustrates, very schematically and in perspective, a pair of elements whose capacitance can be varied in a controlled manner of a second type (not to scale)

FIG. 5 illustrates, in perspective, a pair of elements whose capacitance can be varied in a controlled manner. This concerns a micromechanical element 550 or 551 (see FIG. 11) having a membrane 350 (depicted in broken lines) immovably attached to a partially hollowed-out support 351. This membrane 350 carries on one face 352, which will be described here as "lower", conductive tracks which will be described later, and which, in cooperation with other tracks carried by a face 353, which will be described as "upper", of another support 354, form the variable capacitances (see FIGS. 6 and 8).

Advantageously, the two supports 351 and 354 are immovably attached to one another in a manner which will be described later.

The membrane 350 (see FIGS. 5 to 7) is an element with very small dimensions, typically a few thousand micrometres in length for a width on the order of a thousand micrometres and a thickness of the order of ten micrometres. Of course, these dimensions are given by way of example and may vary according to requirements.

As illustrated better in FIG. 7, the membrane 350 is an element mounted able to rotate around an axis I, by virtue of axial torsion arms 355, opposite one another, and which extend a central part 356, here of rectangular form, the lower face 352 of which supports the tracks. The torsion arms 355 are placed substantially in the middle of each small side of the rectangle delimiting the central part 356, with the result that the axis of rotation I coincides substantially with the longitudinal median axis of the membrane 350. The membrane 350 (its central part 356 and its torsion arms 355) may be subdivided into two parts 357 and 358, here substantially identical, and placed symmetrically on either side of a plane P perpendicular to the face 352 and containing the axis of rotation I.

As illustrated in FIG. 6, each half-part 357 or 358 of the membrane 350 carries a high-frequency conductive track 359a or 359b and a low-frequency track 360a or 360b. Preferably, the HF tracks 359a and 359b are placed symmetrically on either side of the plane P. The same applies, preferably, for the low-frequency tracks 360a and 360b, which are placed symmetrically on either side of this plane P. Furthermore, the low-frequency tracks 360a and 360b are, preferably, flanked by the high-frequency tracks 359a and 359b, which means that the LF tracks 360a and 360b are closer to the axis I than the HF tracks 359a and 359b. Of course, a different procedure could be followed, the low-frequency tracks then flanking the high-frequency tracks, the latter consequently being closer to the axis I than the low-frequency tracks.

As indicated previously, in order to form capacitances, each track of the membrane 350 has corresponding to it, respectively, a track placed on the upper face 352 of the support 354. Thus, the HF track 359a has an HF track 369a corresponding to it, the LF track 360a has an LF track 370a corresponding to it, the LF track 360b has an LF track 370b corresponding to it and the HF track 359b has an HF track 369b corresponding to it. "Correspond" means here the fact that the tracks belonging to two different supports 351 and 354 are, at rest, substantially parallel and superposed one upon the other, and have a substantially identical general form (see FIGS. 8, 9A and 9B), both in the axial direction (parallel to the axis I) and in a transverse direction (perpendicular to the axis I). In this way, the tracks which correspond, for example 359a and 369a, form a capacitance.

In order to vary the value of a capacitance formed in this way, it suffices to vary the distance s which separates two thin tracks which correspond. To do this, it suffices to cause the rotation (or torsion) of the membrane 350 around the axis I. This is because, in this situation, which is illustrated better in FIG. 10, a rotation of the membrane 350 by an angle φ will lead to the tracks which correspond (here 359a and 369a) moving closer together, and the tracks placed symmetrically on the other side of the plane P (here 359b and 369b) moving further apart. A pair of high-frequency tracks moving closer together by a distance d will correspond to the high-frequency tracks which are opposite with respect to the plane P moving further apart by a height d. In this way, a variable-capacitance element pair is implemented, the capacitances of each element varying in an opposite manner, one increasing when the other decreases, and vice versa.

In order to cause the rotational driving of the membrane 350, a control voltage VLF is used. As indicated previously during the description of the first embodiment with varactors, the control voltage VLF is that delivered by the low-frequency channel. This voltage VLF is injected into the micromechanical element pair through its low-frequency tracks.

In the embodiment illustrated in FIGS. 9A and 9B, each track 370a or 370b of the support 354 has an extension 393a or 393b which is connected to the second input of the device (see FIG. 11) so as to be supplied with low frequency VLF. These two extensions 393a and 393b are supplied independently of one another by low-frequency signals phase-shifted by π (180°).

This phase shift is obtained, for example, by splitting into two channels, one being phase shifted by π with respect to the other, on the one hand, the low-frequency supply line (the second input) which supplies the multiplier of the "upper" part via the π/2 phase shifter 21 and, on the other hand, the low-frequency supply line (the second input) which directly supplies the multiplier of the "lower" part. The phase shifting by t of one channel with respect to the other is obtained, preferably, by an inverter 500 or 501.

The high frequency is, preferably, transmitted to the micromechanical structure by its membrane 350. To do this, the two HF tracks 359a and 359b are connected by one of their ends to the first input, by means of an extension 379 carried by one of the torsion arms 355.

Figure 11:
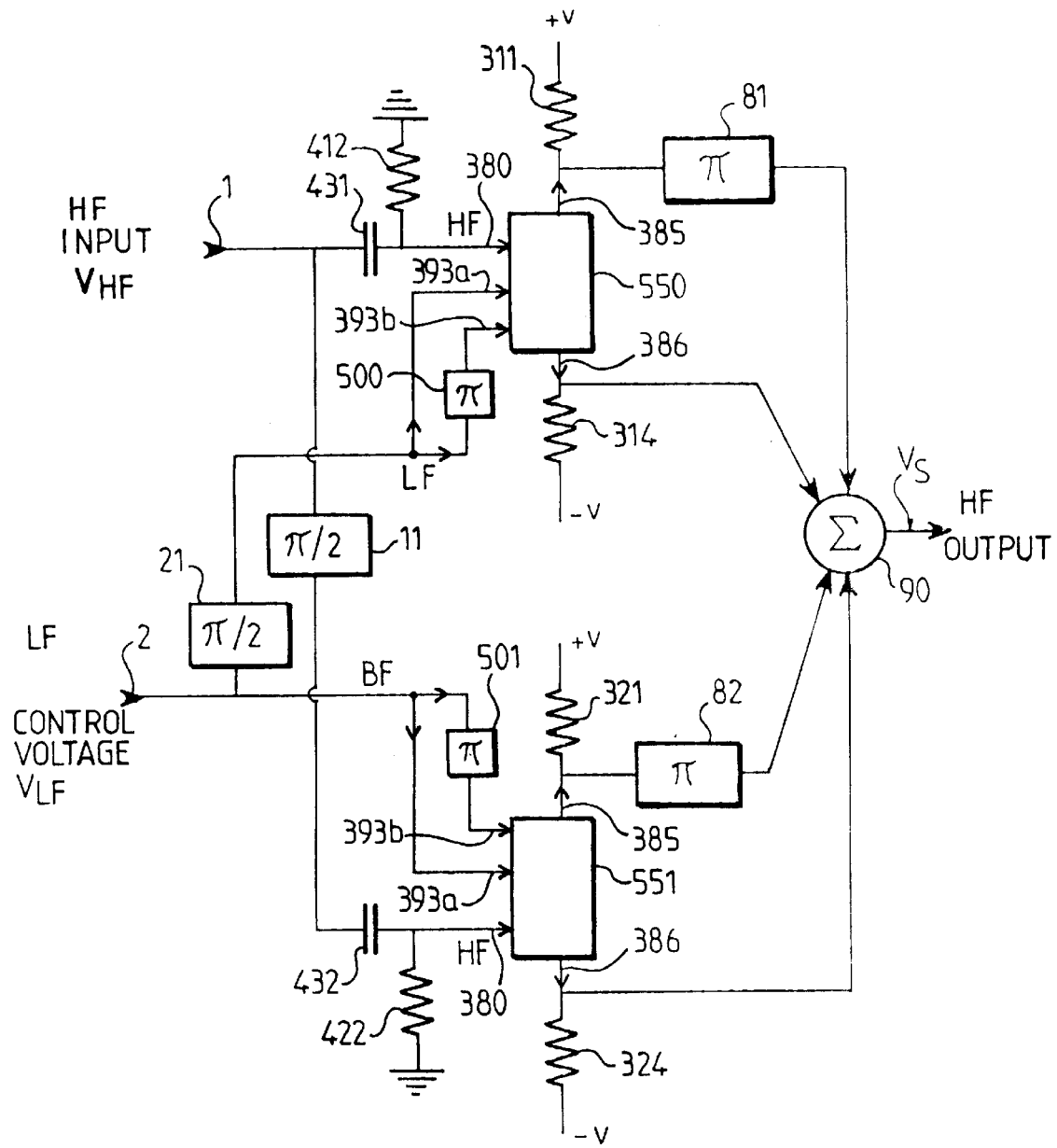
FIG. 11 is a diagram of one embodiment of a frequency translating device according to the invention equipped with pairs of elements whose capacitance can be varied in a controlled manner of the second type.

Preferably, supplying the extension 379 of the high-frequency tracks of the membrane 350 is performed via the support 354, which, to that end, has a high-frequency supply track 380. The connection between this high-frequency supply track 380 and the extension 379 of the high-frequency tracks of the membrane 350 is performed using a conductive pad, or a contact electrode, for example formed on the membrane at 381. As a variant, this contact pad or electrode may be formed on the HF supply track 380. As illustrated in FIG. 11, the HF supply track 380 is connected to the first HF input 1 via the capacitor 431 or 432.

Preferably, the low-frequency tracks 360a and 360b carried by the membrane 350 are connected to one another by one of their ends, this connection being extended by an extension 382 carried by the radial arm 355 which is opposite the radial arm carrying the high-frequency extension 379. In the example illustrated in FIGS. 9A and 9B, this low-frequency extension 382 is connected to the earth of the device via the support 354, which, to that end, has an earth connection track 383. The connection between the low-frequency extension 382 of the membrane 350 and the support 354 is performed, as for the high frequency, by means of a contact pad 384 or an electrode, which is for example carried by the membrane (as illustrated in the figure) but as a variant it could be carried by the earth connection track 383.

It is important to note that, in this embodiment, the high-frequency input and the low-frequency input of each multiplier are decoupled. This is why the frequency translating device illustrated in FIG. 11 is simplified compared with that illustrated in FIG. 2. On account of the decoupling, the resistors 412 and 422 are from now on connected to earth, respectively. Furthermore, it is not essential (as illustrated in FIG. 11) to provide, on the phase-shifted low-frequency supply channels, an R-C type cell of the type of those illustrated in FIGS. 2 to 4, and having the references 410, 411 and 420, 421. Finally, the inductors L illustrated in FIG. 4, placed between the high-frequency supply point 380 and the high-frequency tracks 359a and 359b, may be used to perform a filtering, with an adaptation of the tracks of FIG. 9A.

In this example, the high-frequency signal enters by means of the high-frequency tracks of the membrane 350, and is then transmitted by capacitive coupling to the high-frequency tracks 369a and 369b carried by the support 354. The high-frequency signals are then extracted from the high-frequency tracks of the support 354 by outputs 385 and 386 implemented in the form of extensions (here perpendicular) of the said tracks. These two outputs supply the summer 90, one 386 being directly connected to the latter, the other 385 undergoing a phase shift by one of the means 81 or 82 described previously with reference to FIGS. 2 to 4.

In this micromechanical type embodiment, it is particularly advantageous that the high-frequency phase shifts 11, 81 and 82 are implemented by delay lines, and more particularly in printed line on substrate technology. The substrate may be of the conventional printed circuit type, for example made of epoxy, or of the microstrip line on silicon type.

The dimensions and forms of the different tracks, the dimensions of the membrane and the distance s between the tracks carried by the membrane and by the support 354 depend, notably, on the high-frequency input signals VHF and the low-frequency input signals VLF of the device, and on the desired output signals.

In such a structure, it is possible to determine the angle of equilibrium φ which is reached when a low-frequency control voltage V=VLF which is below a limit voltage is applied. The capacitance formed by the pairs of tracks which correspond is also determined. This equilibrium is reached when the moment of the elastic torsion force of the membrane fully balances the moment of the electrostatic attraction force. On the assumption that the angle of rotation φ of the membrane 350 remains small, equilibrium is given by the formula (1) in the Annex.

In this formula (1), V represents the control voltage, W represents the length of the HF track, b-a represents the width of this track (see FIGS. 8 and 10), s represents the distance separating the tracks at rest (that is substantially the air gap at the center), γ represents the elastic torsion constant of the membrane and $\epsilon_0$ represents the permittivity of free space.

Furthermore, the value of the capacitance which exists between the high-frequency tracks which correspond may be calculated as a function of the angle φ of the membrane, the distance s between tracks at rest, and the length of the said tracks. The formula making it possible to calculate this value of the capacitance is given under reference (2) in the Annex.

It may be demonstrated that the formula (1) giving the angle of equilibrium of the structure can be simplified. This simplification is given in the Annex by the formula (3). The resonant frequency of the structure can also be determined. This is done by starting from the fundamental dynamics equation, applied to the rotation (formula (4) in the Annex). In this equation, I represents the moment of inertia of the membrane, α represents the damping coefficient, β represents the effect of friction of the air on the membrane, $M_E$ represents the moment of the electrostatic force which is a non-linear function of the angle of rotation φ, and $M_T$ represents the moment of the torsional torque, which is substantially equivalent to γφ.

The formula (4) can be linearized if it is considered that the angles of rotation are small, which amounts to saying that the moment of the electrostatic force $M_E$ varies little from the value which it has for a zero angle of rotation (φ=0). The resonant frequency $f_r$ of the structure, and a quality coefficient Q, are deduced from this linearization. The expressions for these two parameters are given by the formulae (5) and (6) in the Annex.

The resonant frequency $f_r$ can be expressed approximately as a function of the geometric magnitudes of the system. This approximation is given by the formula (7) in the Annex, in which the variable t represents the thickness of the membrane.

Evaluation of the damping coefficient a can be carried out by studying the friction of the air on the membrane 350. This evaluation can be simplified if through holes 387 of chosen dimensions, of the type of those illustrated in FIG. 9A, are made in the membrane. Such holes (or apertures) allow better evacuation of the air, as well as a reduction of the surface forces generated by the air flows which circulate inside the structure.

By way of an example, non-limitative embodiment, the structure may have dimensions whose orders of magnitude are given below:

length of the membrane: a few thousand micrometres;

total width of the membrane: of the order of a thousand micrometres;

thickness of the membrane (t): of the order of ten micrometres;

distance between tracks at rest (air gap s): of the order of a few micrometres;

length of the axial torsion arms: of the order of a few hundred micrometres;

width of the axial torsion arms: of the order of a hundred micrometres;

length of the high-frequency tracks (W): of the order of a thousand micrometres; and width of the high-frequency tracks (b-a): of the order of a few hundred micrometres.

Regarding more particularly the dimensions of the conductive tracks, and notably the high-frequency ones, the empirical relationship given by equation (8) in the Annex can be used to determine the length L as a function of the HF frequency.

The distance s (or air gap), which separates substantially the thin tracks carried by the membrane 350 and by the support 354, is preferably fixed by the height (or depth) of a cavity 388 formed in the support 354 (see FIG. 6). Of course, a different procedure could be followed.

This structure may be made using glass and silicon materials. More precisely, it is particularly advantageous to make the support 354 of glass, and the membrane 350 of silicon.

The membrane 350 forms part of the support 351 which is preferably composed of a stack of layers having a silicon dioxide $SiO_2$ layer 389 inserted between a thick lower layer 390 of silicon and a thin upper layer 391 also of silicon and in which the membrane 350 is formed.

Advantageously, also provided in this stack, below the thick lower layer of silicon 390, is an insulating layer 392. This makes it possible to directly use substrates known to persons skilled in the art by the acronym SOI (for "Silicon On Insulator"). By way of example, the thin upper layer of silicon, in which the membrane 350 is formed, has a thickness of the order of ten micrometres, the silicon dioxide layer 389 has a thickness of the order of a few micrometres, and the thick lower layer of silicon 390 has a thickness of a few hundred micrometres.

The substrates 351 and 354 are immovably attached to one another after the membrane 350 has been made. This bonding may be performed by any technique known to persons skilled in the art, for example by gluing.

Preferentially, the membrane 350 is made by a plasma etching technique well known to persons skilled in the art, the said etching being performed on the side opposite the layer 391 containing the membrane, that is the side of the insulating layer 392 (or of the silicon layer 390 when the structure does not have an insulating layer).

Furthermore, the cavity 388 which makes it possible to control the distance s between tracks is formed, preferably, by chemical etching of the glass support 354.

Furthermore, and preferably, with the aim of protecting the tracks, passivation of the upper face 353 of the glass support 354 is carried out after layout of the tracks 369 and 370, and before the support 354 is immovably attached to the support 351.

The materials composing the tracks and the contact pads (or electrodes) are chosen so as to optimize the propagation of the signals and the quality of the contacts between certain tracks and the pads or electrodes.

As indicated previously, the structure which has just been described is perfectly suitable for the implementation of fully integrated components of very small dimensions, and notably for the implementation of multipliers for frequency translators of the type of that illustrated in FIG. 11.

The advantages of the assemblies proposed are as follows:

very low consumption, typically of the order of 10 μA, since all the variable-capacitance elements of one and the same pair are reverse biased. It is known that a low consumption is very important for any type of portable equipment, notably;

very good parasitic frequency rejection, typically below −30 dB, on account of the multiplication function being very close to the ideal;

all the frequencies composing a given signal are simultaneously translated by the same amount, hence the wide-band and even very-wide-band qualification of the translator.

The invention is not limited to the embodiments described with reference to the figures, but includes all the variants which persons skilled in the art may envisage within the context of the claims below.

Thus, the respective types of the different phase-shift modules may vary according to application, and notably according to the frequencies used. It is clear that, for wide-band, or very-wide-band, applications, wide-band or very-wide-band phase shifters, like for example the aforementioned phase-difference networks or cells, will be used. For narrow-band applications, delay lines, formed for example using coaxial cables will preferably be used as phase shifters, as described previously.

Similarly, the type of multiplier may vary provided that they each comprise a pair of elements whose capacitance can be varied in a controlled manner, jointly and in opposite senses, connected in parallel.

Accompanying the above specific description is an annex appended hereto which sets out the formulae referred to above. It should be understood that the annex, therefore, forms a part of the specific description.

While there have been shown and described preferred embodiments of the invention, various modifications and improvements might well be made by those skilled in the art without departing from the spirit of the invention. Thus it is to be understood that, within the scope of the appended claims, the invention may be practiced otherwise than as specifically described above.

ANNEX $$\Phi = \frac{\epsilon_0 V^2 W (b^2 - a^2/4s^2)}{\gamma - \epsilon_0 V^2 W (b^3 - a^3/3s^3)} \quad (1)$$

$$C = \frac{\epsilon_0 W}{\phi} \ln\left(\frac{s - a\phi}{s - b\phi}\right) \quad (2)$$

$$\phi \infty \frac{V^2 W b^2}{\gamma s^2} \quad (3)$$

$$I \frac{d^2 \phi}{dt^2} = M_E - M_T - \alpha \frac{d\phi}{dt} - \beta \phi \quad (4)$$

$$f_r = \frac{1}{2\pi}\sqrt{\frac{\gamma}{I}} \quad (5)$$

$$Q = \frac{1}{\alpha}\sqrt{\gamma I} \quad (6)$$

$$f_r \infty \frac{I}{2\pi}\sqrt{\frac{\gamma}{W t b^3}} \quad (7)$$

$$f_{max}(\text{MHz}) = \frac{2500}{L^2 (\text{cm})} \quad (8)$$

What is claimed is:

1. A frequency effect electronic device comprising:
   first and second multipliers each suitable for receiving the same high-frequency signal on a first input in quadrature with respect to one another, and the same low-frequency signal on a second input also in quadrature with respect to one another; and
   a summer to sum outputs of the multipliers,
   wherein each multiplier comprises a pair of elements connected from a common point in opposite senses, and a capacitance of each element of the pair of elements can be varied in a controlled manner, and wherein the respective outputs of the pair of elements are combined additively, considering their phase opposition, in order to form the output of the respective multiplier.

2. A device according to claim 1, wherein each element of the pair of elements in each of the first and second multipliers includes a varactor, and the two varactors in each multiplier are connected from the common point and are reverse biased.

3. A device according to claim 2, wherein the first input and the second input of each multiplier reach the common point of the two varactors by separate decoupled connections.

4. A device according to claim 1, wherein the high-frequency signal and the low-frequency signal are phase shifted using phase shifts to generate quadrature signals provided, respectively, to the first inputs and the second inputs, and the phase shifts are implemented using phase-difference networks.

5. A frequency effect electronic device comprising:
   two multipliers suitable for receiving one and the same high-frequency signal on first inputs in quadrature with respect to one another, and one and the same low-frequency signal on second inputs also in quadrature with respect to one another; and
   a summer of outputs of these multipliers,
   wherein each multiplier comprises a pair of elements whose capacitance can be varied in a controlled manner, jointly and in opposite senses, connected in parallel, and wherein the respective outputs of the two elements of each pair are combined additively, considering their phase opposition, in order to form the outputs of the two multipliers, and
   wherein each of the pair of elements includes:
      first support means carrying on one face:
         two substantially identical high-frequency conductive tracks, placed symmetrically on either side of a plane of symmetry, and each having one output forming an output of the multiplier, and
         two substantially identical low-frequency conductive tracks supplied separately by the second input and placed symmetrically on either side of the plane of symmetry;
      second support means in part of which, able to rotate around an axis, by means of opposite axial arms, a membrane is suspended, subdivided, on either side of a plane of symmetry including the axis, into two substantially identical half-parts, the membrane carrying on one face:
         two substantially identical ultrahigh-frequency conductive tracks, each having one end connected to the first input, and placed symmetrically on either side of the plane of symmetry, and
         two substantially identical low-frequency conductive tracks, each having one end connected to ground, and placed symmetrically on either side of the plane of symmetry;
      the second support means being immovably attached to the first support means so that the planes of symmetry of the membrane and of the first support means are substantially identical and the high-frequency, respectively low-frequency, tracks of the first support means are superposed on the high-frequency, respectively low-frequency, tracks of the second support means; and a half-membrane provided with its HF track and its LF track, on the one hand, and the corresponding HF track and LF track carried by the first support means, thus constituting a pair element.

6. A device according to claim 5, wherein the high-frequency and low-frequency tracks are parallel to one another, the high-frequency tracks flanking the low-frequency tracks.

7. A device according to claim 5, wherein the high-frequency and low-frequency tracks are parallel to one another, the low-frequency tracks flanking the high-frequency tracks.

8. A device according to claim 5, wherein the first support means comprise a cavity of chosen depth, the bottom of which defines the face carrying the high-frequency and low-frequency conductive tracks.

9. A device according to claim 5, wherein the high-frequency and low-frequency tracks of at least the first support means are covered with a very thin passivation layer.

10. A device according to claim 5, wherein the membrane has at least one through hole of chosen dimensions.

11. A device according to claim 5, wherein the membrane is formed by etching of the second support means.

12. A device according to claim 5, wherein the first support means are formed from a glass block, and the second support means are formed from a stack composed of a layer of silicon dioxide inserted between a lower substrate of silicon and an upper layer of silicon, the membrane being formed in the upper layer of silicon.

13. A device according to claim 12, wherein the lower layer of silicon is placed on an insulating material.

14. A device according to claim 5, wherein the high-frequency signal is phase shifted using high-frequency phase shifts to generate quadrature signals provided to the first inputs, and the high-frequency phase shifts are implemented by delay lines, which are implemented as printed lines on a substrate.

15. A device according to claim 5, wherein the first input and the second input of each multiplier reach the common point of the pair of elements by separate decoupled connections, and the separate decoupled connections are connected to a supply of a biasing reference voltage.

16. A frequency effect electronic device comprising:

two multipliers suitable for receiving one and the same high-frequency signal on first inputs in quadrature with respect to one another, and one and the same low-frequency signal on second inputs also in quadrature with respect to one another; and a summer of outputs of these multipliers, wherein each multiplier comprises a pair of elements whose capacitance can be varied in a controlled manner, jointly and in opposite senses, connected in parallel, and wherein the respective outputs of the two elements of each pair are combined additively, considering their phase opposition, in order to form the outputs of the two multipliers, and each multiplier includes an inductor between each element of the pair of elements and its common point.

17. A device according to claim 16, wherein each of the pair of elements in each of the two multipliers includes a varactor, and the two varactors in each multiplier are connected in parallel from the common point and are reverse biased.

18. A device according to claim 17, wherein the first input and the second input of each multiplier reach the common point of the two varactors by separate decoupled connections.

19. A frequency effect electronic device comprising:

two multipliers suitable for receiving one and the same high-frequency signal on first inputs in quadrature with respect to one another, and one and the same low-frequency signal on second inputs also in quadrature with respect to one another; and a summer of outputs of these multipliers, wherein each multiplier comprises a pair of elements whose capacitance can be varied in a controlled manner, jointly and in opposite senses, connected in parallel, and wherein the respective outputs of the two elements of each pair are combined additively, considering their phase opposition, in order to form the outputs of the two multipliers, and wherein the high-frequency signal is phase shifted using high-frequency phase shifts to generate quadrature signals provided to the first inputs, and the high-frequency phase shifts are implemented by delay lines, which are implemented using a coaxial cable.

20. A frequency effect electronic device comprising:

two multipliers suitable for receiving one and the same high-frequency signal on first inputs in quadrature with respect to one another, and one and the same low-frequency signal on second inputs also in quadrature with respect to one another; and a summer of outputs of these multipliers, wherein each multiplier comprises a pair of elements whose capacitance can be varied in a controlled manner, jointly and in opposite senses, connected in parallel, and wherein the respective outputs of the two elements of each pair are combined additively, considering their phase opposition, in order to form the outputs of the two multipliers, and wherein the low-frequency signal is phase shifted using low-frequency phase shifts to generate quadrature signals provided to the second inputs, and the low-frequency phase shifts are implemented by one or more "R-C" type cells forming a differentiator on one channel, and one or more "C-R" type cells forming an integrator on one other channel, the whole being arranged to provide a phase quadrature of one channel with respect to the other channel.

21. A frequency effect electronic device comprising:

two multipliers suitable for receiving one and the same high-frequency signal on first inputs in quadrature with respect to one another, and one and the same low-frequency signal on second inputs also in quadrature with respect to one another; and a summer of outputs of these multipliers, wherein each multiplier comprises a pair of elements whose capacitance can be varied in a controlled manner, jointly and in opposite senses, connected in parallel, and wherein the respective outputs of the two elements of each pair are combined additively, considering their phase opposition, in order to form the outputs of the two multipliers, and wherein each element of a Pair is defined by a varactor, the two varactors of a pair are connected in parallel from a common point and reverse biased, the first input and the second input of each multiplier reach the common point of the two varactors by separate decoupled connections, and the separate decoupled connections are connected to a supply of a biasing reference voltage.

* * * * *